(12) United States Patent
Anderson et al.

(10) Patent No.: US 8,080,465 B2
(45) Date of Patent: Dec. 20, 2011

(54) SEMICONDUCTOR WAFER STRUCTURE WITH BALANCED REFLECTANCE AND ABSORPTION CHARACTERISTICS FOR RAPID THERMAL ANNEAL UNIFORMITY

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/728,463

(22) Filed: Mar. 22, 2010

(65) Prior Publication Data

US 2010/0173500 A1    Jul. 8, 2010

Related U.S. Application Data

(62) Division of application No. 11/678,756, filed on Feb. 26, 2007, now Pat. No. 7,759,773.

(51) Int. Cl.
| | |
|---|---|
| *H01L 21/301* | (2006.01) |
| *H01L 21/46* | (2006.01) |
| *H01L 21/78* | (2006.01) |
| *H01L 21/31* | (2006.01) |
| *H01L 21/469* | (2006.01) |

(52) U.S. Cl. .............. 438/462; 438/761; 257/E21.211
(58) Field of Classification Search ............ 438/462, 438/761; 257/E21.211
See application file for complete search history.

(56) References Cited

U.S. PATENT DOCUMENTS

| | | | |
|---|---|---|---|
| 4,525,380 A | 6/1985 | Arai et al. | |
| 5,336,641 A | 8/1994 | Fair et al. | |
| 5,523,262 A | 6/1996 | Fair et al. | |
| 5,841,110 A | 11/1998 | Nenyei et al. | |
| 5,897,381 A | 4/1999 | Aronowitz et al. | |
| 5,956,603 A | 9/1999 | Talwar et al. | |
| 6,015,745 A | 1/2000 | Adkisson et al. | |
| 6,262,435 B1 | 7/2001 | Plat et al. | |
| 6,300,243 B1 | 10/2001 | Thakur | |

(Continued)

FOREIGN PATENT DOCUMENTS

DE    10329212    1/2005

(Continued)

OTHER PUBLICATIONS

Anderson et al., U.S. Appl. No. 12/719,153, Office Action Communication, Jan. 10, 2011, 17 pages.

(Continued)

*Primary Examiner* — David S Blum
(74) *Attorney, Agent, or Firm* — Gibb I.P. Law Firm, LLC; Richard M. Kotulak, Esq.

(57) ABSTRACT

Disclosed are embodiments of semiconductor wafer structures and associated methods of forming the structures with balanced reflectance and absorption characteristics. The reflectance and absorption characteristics are balanced by manipulating thin film interferences. Specifically, thin film interferences are manipulated by selectively varying the thicknesses of the different films. Alternatively, reflectance and absorption characteristics can be balanced by incorporating an additional reflectance layer into the wafer structure above the substrate. Methods of forming a semiconductor structure begin by forming a substrate, forming an insulator layer on the substrate, and forming a first film on a first portion of the insulator layer. Methods form a second film, different from the first film, on a second portion of the insulator layer adjacent to the first film such that a first net reflectivity of the first film, the insulator layer, and the substrate is approximately equal to a second net reflectivity of the second film, the insulator layer and the substrate.

14 Claims, 5 Drawing Sheets

U.S. PATENT DOCUMENTS

| | | | |
|---|---|---|---|
| 6,403,923 | B1 | 6/2002 | Tay et al. |
| 6,414,364 | B2 | 7/2002 | Lane et al. |
| 6,569,720 | B2 | 5/2003 | Kunii |
| 6,665,858 | B2 | 12/2003 | Miyazaki |
| 6,812,550 | B1 | 11/2004 | En et al. |
| 6,867,080 | B1 | 3/2005 | Paton et al. |
| 6,875,623 | B2 | 4/2005 | Niwayama et al. |
| 6,916,690 | B2 | 7/2005 | Chang |
| 7,071,530 | B1 | 7/2006 | Ding et al. |
| 7,344,929 | B2 | 3/2008 | Mehrotra et al. |
| 7,589,027 | B2 | 9/2009 | Lee |
| 7,745,334 | B2 | 6/2010 | Press et al. |
| 7,871,895 | B2 | 1/2011 | Divakaruni et al. |
| 2004/0033666 | A1 | 2/2004 | Williams et al. |
| 2004/0077149 | A1 | 4/2004 | Renau |
| 2004/0084427 | A1 | 5/2004 | Talwar et al. |
| 2004/0188801 | A1 | 9/2004 | Ehrichs |
| 2004/0195626 | A1 | 10/2004 | Yamada et al. |
| 2004/0259387 | A1 | 12/2004 | Yamazaki et al. |
| 2005/0003638 | A1 | 1/2005 | Stolk |
| 2005/0009344 | A1 | 1/2005 | Hwang et al. |
| 2005/0059224 | A1 | 3/2005 | Im |
| 2005/0085047 | A1 | 4/2005 | DeLoach et al. |
| 2005/0173802 | A1 | 8/2005 | Tabara et al. |
| 2005/0189340 | A1 | 9/2005 | Talwar et al. |
| 2005/0191044 | A1 | 9/2005 | Aderhold et al. |
| 2006/0099745 | A1 | 5/2006 | Hsu et al. |
| 2006/0154475 | A1 | 7/2006 | Mehrotra et al. |
| 2006/0228897 | A1 | 10/2006 | Timans |
| 2007/0063223 | A1 | 3/2007 | Choi |
| 2007/0069293 | A1 | 3/2007 | Kavalieros et al. |
| 2007/0230553 | A1 | 10/2007 | Talbot et al. |
| 2008/0230843 | A1 | 9/2008 | Zhang et al. |
| 2009/0302414 | A1 | 12/2009 | Ebefors et al. |

FOREIGN PATENT DOCUMENTS

| | | |
|---|---|---|
| JP | 06-295923 | 10/1994 |
| RU | 2206141 | 6/2003 |
| WO | 9319484 | 9/1993 |
| WO | 2007038575 | 4/2007 |

OTHER PUBLICATIONS

Anderson et al., U.S. Appl. No. 12/719,153, Office Action Communication, Jul. 23, 2010, 15 pages.

Laviron et al., "Intra-Die Temperature Non Uniformity Related to Front Side Emissivity Dependence during Rapid Thermal Annealing", 203rd ECS Meeting, Paris, Apr. 27-May 2, 2003, paper #880, pp. 1-9.

Anderson et al., U.S. Appl. No. 11/678,783, Office Action Communication, Apr. 30, 2009, 12 pages.

Anderson et al., U.S. Appl. No. 11/678,745, Office Action Communication, May 13, 2009, 19 pages.

Anderson et al., U.S. Appl. No. 11/869,768, Office Action Communication, May 14, 2009, 26 pages.

PCT International Search Report and Written Opinion dated Aug. 27, 2009, pp. 1-12.

Anderson et al., U.S. Appl. No. 11/869,768, Office Action Communication, Nov. 24, 2009, 5 pages.

Anderson et al., U.S. Appl. No. 11/678,745, Notice of Allowance, Nov. 18, 2009, 10 pages.

Anderson et al., U.S. Appl. No. 11/678,799, Notice of Allowance, Feb. 17, 2010, 4 pages.

Anderson et al., U.S. Appl. No. 11/678,799, Office Action Communication, Apr. 15, 2009, 19 pages.

Anderson et al., U.S. Appl. No. 11/678,799, Office Action Communication, Oct. 27, 2009, 15 pages.

Anderson et al., U.S. Appl. No. 11/678,756, Notice of Allowance, Mar. 15, 2010, 3 pages.

Anderson et al., U.S. Appl. No. 12/719,153, Office Action Communication, Apr. 14, 2011, 16 pages.

Anderson et al., U.S. Appl. No. 12/719,153, Notice of Allowance, Aug. 8, 2011, 12 pages.

SEMICONDUCTOR WAFER STRUCTURE WITH BALANCED REFLECTANCE AND ABSORPTION CHARACTERISTICS FOR RAPID THERMAL ANNEAL UNIFORMITY

CROSS-REFERENCE TO RELATED APPLICATIONS

This application is a Continuation of Ser. No. 11/678,756, filed Feb. 26, 2007, now U.S. Pat. No. 7,759,773, issued on Jul. 20, 2010, the complete disclosure of which, in its entirety, is herein incorporated by reference.

BACKGROUND

1. Field of the Invention

The embodiments of the invention generally relate to semiconductor wafers and, more particularly, to semiconductor wafer structures and methods of forming the structures that balance variations in reflectance and absorption characteristics.

2. Description of the Related Art

Semiconductor wafer fabrication often involves the use of a rapid thermal anneal (RTA) process to affect the electrical properties of active devices on the wafer. More specifically, an RTA process can be used to activate dopants, diffuse dopants, anneal structures, repair damage from ion implantation processes, etc. RTAs are typically performed by powerful halogen lamp-based heating equipment, flash lamps, or lasers which direct radiation onto a wafer surface in order to change the wafer temperature. However, variations in the reflectance and absorption in different regions of a wafer, e.g., due to different materials and/or different thicknesses of materials, can result in non-uniform temperature changes across the wafer. These non-uniform temperature changes can result in temperature variations on the wafer of 10° C. or more.

Variations in reflectance and absorption characteristics can be caused by a variety of different factors including, different materials, the patterns of those materials in different regions of a wafer and the thicknesses of those materials in different regions of the wafer. For example, dielectric materials, such as silicon dioxide, in shallow trench isolation structures have different reflectance and absorption characteristics than silicon materials incorporated into devices. Dense regions of a wafer (i.e., regions of a wafer having a high number of devices) will have a higher silicon to silicon dioxide ratio than less dense regions. Different silicon to silicon dioxide ratios in different regions of the wafer will result in non-uniform temperature changes during an RTA. These non-uniform temperature changes can cause variations in dopant activation, dopant diffusion, damage repair, etc. across the wafer and can, thereby, cause variations in threshold voltages, sheet resistances, drive currents, leakage currents, etc. between devices on different regions of the wafer. Thus, non-uniform temperature changes can cause significant, location-dependent, variations in device performance.

Furthermore, as technologies continue to scale, anneal ramp times will continue to decrease (e.g., to sub-second ramps) and these faster ramp times will be accompanied by an even greater sensitivity to variations in reflectance and absorption characteristics across a wafer.

SUMMARY

In view of the foregoing, disclosed herein are embodiments of semiconductor wafer structures that have balanced reflectance and absorption characteristics (i.e., approximately equal or uniform reflectance and absorption characteristics across the wafer) due to the avoidance of thin film interferences and/or the incorporation of an additional reflectance layer. Also disclosed are embodiments of the methods of forming the semiconductor structures.

More particularly, an embodiment of the semiconductor wafer structure of the invention comprises multiple sections each with multiple layers of thin films. Specifically, the wafer structure may comprise at least one first section (e.g., a device region) comprising a first film on a first portion of an insulator layer above a semiconductor substrate and at least one second section (e.g., a shallow trench isolation region) comprising a second different film on a second portion of the same insulator layer. Furthermore, a given source of thermal annealing with a given wavelength as measured in vacuum, will have a first wavelength in the first film, referred to herein as a first reflectivity wavelength, and a second wavelength in the second film, referred to here in as a second reflectivity wavelength. The first film and the substrate can each comprise a semiconductor (e.g., silicon) with a first index of refraction, and a first reflectivity wavelength. Similarly, the second film and the insulator layer can each comprise an insulator (e.g., silicon dioxide) with a second index of refraction, and a second reflectivity wavelength. However, the thicknesses of these films can be selectively varied so that the net reflectivity of the different sections of the wafer will be approximately uniform, thereby, allowing for uniform heating during rapid thermal anneals.

More specifically, a first thickness of the first film can be selectively different from a second thickness of the second film such that a first net reflectivity of the first sections (i.e., of the first film, the insulator layer and the substrate) is approximately equal to a second net reflectivity of the second sections (i.e., of the second film, the insulator layer and the substrate). That is, the film thicknesses are selected so as to eliminate or minimize reflectivity differences between the different films. This can be accomplished, for example, if the first thickness of the first film comprises a multiple of one-half the first reflectivity wavelength, if the third thickness of the insulator layer comprises a multiple of one-quarter of the second reflectivity wavelength and if a combined thickness of the insulator layer and the second film comprises an odd multiple of one-quarter of the second reflectivity wavelength (i.e., if the second thickness of the second film comprises a multiple of one-half the second reflectivity wavelength).

An embodiment of the method for forming the semiconductor wafer structure, described above, comprises forming a semiconductor substrate and, then, forming an insulator layer on the substrate. Next, a first film is formed on a first portion of the insulator layer and a second film different from the first film is also formed on a second portion of the insulator layer adjacent to the first film. The first film and the semiconductor substrate can each be formed with a semiconductor having a first reflectivity wavelength (e.g., silicon) and the second film and the insulator layer can each be formed with an insulator with a second reflectivity wavelength (e.g., silicon dioxide). The first and second films are each formed with different predetermined thicknesses such that a first net reflectivity of the first film, the insulator layer, and the substrate is approximately equal to a second net reflectivity of the second film, the insulator layer and the substrate (i.e., the first film is formed with a first thickness that is selectively different from a second thickness of the second film so that the first net reflectivity is approximately equal to the second net reflectivity). That is, the different films are formed with different thicknesses in order to eliminate or minimize the reflectivity difference (i.e., to ensure that the reflectance and absorption characteristics across the wafer are approximately uniform).

More specifically, the insulator layer is formed with a predetermined thickness (ie., a third thickness) that is a multiple of one-quarter of the second reflectivity wavelength. Then, the first film is formed with a predetermined thickness (i.e., the first thickness) that is a multiple of one-half the first reflectivity wavelength and if the first thickness of the first film comprises a multiple of one-half the first reflectivity wavelength and the second film is formed with a predetermined thickness (i.e., the second thickness) that is a multiple of one-half the second reflectivity wavelength such that the combined thickness of the insulator layer and the second film is an odd multiple of one-quarter of the second reflectivity wavelength.

Another embodiment of the semiconductor wafer structure of the invention similarly comprises multiple sections each with multiple layers of thin films that have different indices of refraction, and hence typically differing reflectivities. However, instead of varying the thicknesses of the thin films, this embodiment of the structure incorporates a reflectance layer into the structure above the substrate to balance differences (i.e., to eliminate or minimize the differences) in reflectivity from section to section.

Specifically, the wafer structure can comprise a semiconductor substrate and at least one first section and at least one second section. The first section (e.g., a device region) can comprise a first material (e.g., silicon) with a first index of refraction (and, thus, a first reflectivity) and first thickness above a first portion of the semiconductor substrate. The second section (e.g., a shallow trench isolation region) can comprise a second material (e.g., silicon dioxide) with a second index of refraction (and, thus, a second reflectivity) and second thickness above a second portion of the semiconductor substrate and adjacent to the first material. The reflectivities of the first and second material are different, but the thicknesses are the same. The semiconductor wafer structure further incorporates a reflectance layer between the semiconductor substrate and the first and second materials. This reflectance layer comprises a pre-selected material that balances the reflectivity characteristics (i.e., eliminates or minimizes differences in the reflectivity and absorption characteristics) between the first and second sections.

This reflectance layer can be incorporated into the structure either immediately above the substrate (e.g., in a bulk or silicon-on-insulator (SOI) wafer) or within an insulator layer that is positioned between the substrate and the first and second materials (e.g., within the buried oxide layer of an SOI wafer). Specifically, the reflectance layer can comprise a semiconductor layer (e.g., a silicon germanium layer) that is positioned directly on the semiconductor substrate of a bulk wafer and the first and second materials can be positioned directly on the silicon germanium layer. Alternatively, the reflectance layer can comprise a semiconductor layer (e.g., a silicon germanium layer) that is positioned between the substrate and the insulator layer of an SOI wafer and the first and second materials can be positioned on the insulator layer. Alternatively, the reflectance layer can comprise a silicon layer, a silicon germanium layer or a nitride layer that is embedded within the insulator layer of an SOI wafer and the first and second materials can be positioned on the insulator layer.

Also disclosed are embodiments of a method of forming the semiconductor wafer structure described above as comprising a semiconductor substrate, at least one first section (e.g., a device region) above the substrate, at least one second section (e.g., a shallow trench isolation region) adjacent to the first section above the substrate, and a reflectance layer above the substrate to balance reflectivity (i.e., to eliminate or minimize differences in reflectivity) from section to section. That is, to ensure that the reflectance and absorption characteristics of the wafer are approximately uniform from section to section.

The method comprises selecting materials for the wafer structure. For example, selecting a first material, such as silicon, to form the first section (e.g., the device region) and selecting a second material (e.g., silicon dioxide) to form the second section (e.g., the shallow trench isolation region). The thicknesses of the materials in each section are determined as are the reflectivity differences between the materials (e.g., based on $\lambda_{vacuum}$ and the index of refraction of the materials).

Based on the reflectivity differences, the material that will be used for the reflectance layer is selected.

For a bulk wafer, the selected material can comprise a semiconductor material (e.g., silicon germanium). The semiconductor layer can be formed on the bulk substrate and the sections of first and second material can be formed on the reflectance layer.

For a silicon-on-insulator wafer, the selected material can comprise silicon, silicon germanium or a nitride material and the reflectance layer can be formed either between the substrate and the insulator layer of the SOI wafer or within the insulator layer of the SOI wafer. Specifically, once the material for the reflectance layer is selected (e.g., a semiconductor material, such as, silicon germanium), the reflectance layer can be formed on the substrate. After formation of the reflectance layer, an insulator layer can be formed on the reflectance layer and the first and second sections can be formed on the insulator layer. Alternatively, after the material for the reflectance layer is selected, an insulator layer with an embedded reflectance layer can be formed on the substrate and the first and second sections are formed on the insulator layer.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, variations in reflectance and absorption characteristics can be caused by a variety of different factors including, different materials, the patterns of those materials in different regions of a wafer and the thicknesses of those materials in different regions of the wafer. For example, dielectric materials, such as silicon dioxide, in shallow trench isolation structures have different reflectance and absorption characteristics than silicon materials incorporated into devices. Dense regions of a wafer (i.e., regions of a wafer having a high number of devices) will have a higher silicon to silicon dioxide ratio than less dense regions. Different silicon to silicon dioxide ratios in different regions of the wafer will result in non-uniform temperature changes during an RTA. These non-uniform temperature changes can cause variations in dopant activation, damage repair, etc. across the wafer and can, thereby, cause variations in threshold voltages, sheet resistances, drive currents, leakage currents, etc. between devices on different regions of the wafer. Thus, non-uniform temperature changes can cause significant, location-dependent, variations in device performance. Furthermore, as technologies continue to scale, anneal ramp times will continue to decrease (e.g., to sub-second ramps) and these faster ramp times will be accompanied by an even greater sensitivity to variations in reflectance and absorption characteristics across a wafer. One prior art technique to solve this problem involves slowing the anneal ramp rates; however, this technique can degrade the performance of intrinsic devices.

Therefore, there is a need in the art for wafer structures with balanced reflectance and absorption characteristics (i.e., with approximately uniform or equal reflectance and absorption characteristics across the wafer) in order to ensure uniform temperature changes across the wafer during a rapid thermal anneal process.

Those skilled in the art will generally recognize that the following principles related to the reflectance and absorption characteristics of thin films. First, the reflectivity of a film is related to a specific wavelength (e.g., the wavelength of light used during rapid thermal anneal) in a vacuum divided by the index of refraction of the material used to form the film or $\lambda_{film} = \lambda_{vacuum}/n_{film}$. Refraction is generally defined as the bending of a light wave when it enters a material where its speed is different and the index of refraction is generally defined as the speed of light in a vacuum divided by the speed of light in the particular material. Second, a light wave directed onto a structure with multiple layers of thin films will be at least partially reflected and transmitted at each interface between the layers and the sum of the reflected light waves from each of these interfaces can be calculated to determine the overall reflectivity of the multi-layered structure. Third, if a light wave passes through a first film layer and reflects from a second film layer with a larger index of refraction than the first film, then the phase shift of the reflected wave with respect to the incident light wave will be 180°. However, if a light wave passes through a first film layer and reflects from a second film layer with a smaller index of refraction, then the phase shift of the reflected wave with respect to the incident light wave will be zero. Finally, the incident light waves and the reflected light waves may interfere constructively or destructively (i.e., thin-film interference may occur). With these principles in mind, disclosed herein are embodiments of semiconductor wafer structures that have balanced reflectance and absorption characteristics due to the avoidance of thin film interferences and/or the incorporation of an additional reflectance layer. Also disclosed are embodiments of the methods of forming these semiconductor structures.

Figure 1:
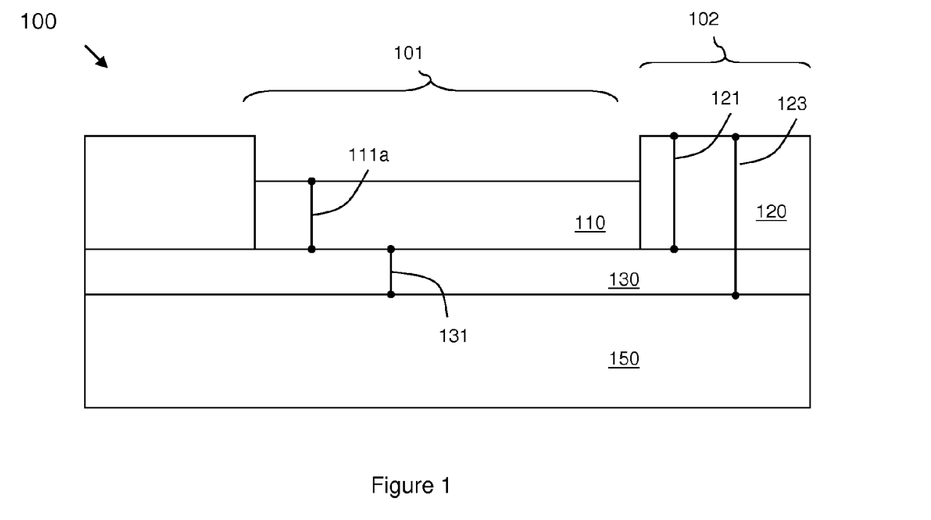
FIG. 1 is a schematic diagram illustrating exemplary wafer structure 100 of the invention.
Figure 2:
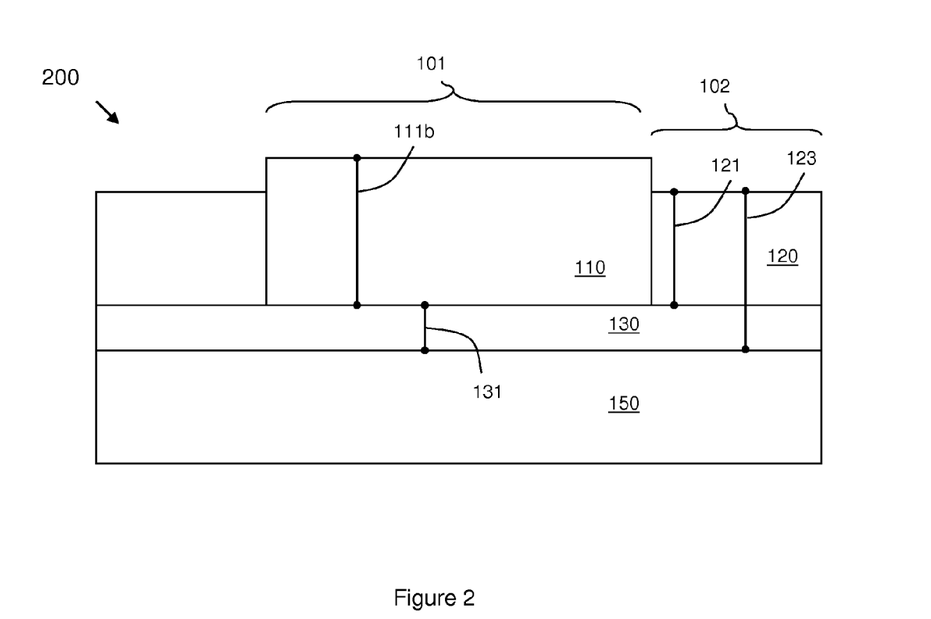
FIG. 2 is a schematic diagram illustrating an exemplary wafer structure 200 of the invention.

More particularly, referring to FIGS. 1 and 2 in one embodiment of the invention, the semiconductor wafer structure 100, 200 of the invention comprises multiple sections 101, 102 each with multiple layers of thin films. Specifically, the wafer structure 100, 200 may comprise at least one first section 101 (e.g., a device region) comprising a first film 110 on a first portion of an insulator layer 130 above a semiconductor substrate 150 and at least one second section 102 (e.g., a shallow trench isolation region) comprising a second different film 120 on a second portion of the same insulator layer 130. Furthermore, a given source of thermal annealing with a given wavelength, as measured in a vacuum, will have a first wavelength in the first film 110 (referred to herein as a first reflectivity wavelength) and a second wavelength in the second film 120 (referred to herein as a second reflectivity wavelength). The first film 110 and the substrate 150 can each comprise a semiconductor (e.g., silicon) with a first index of refraction and a first reflectivity wavelength ($\lambda_{Si}$). Similarly, the second film 120 and the insulator layer 130 can each comprise an insulator (e.g., silicon dioxide) with a second index of refraction and a second reflectivity wavelength ($\lambda_{SiO2}$). However, the thicknesses of these films can be selectively varied so that the net reflectivity of the different sections 101, 102 of the wafer will be approximately uniform (i.e., approximately equal), thereby, allowing for uniform heating during rapid thermal anneals.

More specifically, those skilled in the art will recognize that reflection of electromagnetic radiation incident on a stack of dielectrics will be partially transmitted into the aggregate stack and partially reflected back into the medium from which it was incident. The portion of power transmitted can be determined by well-known methods using Maxwell's equations (see *Classical Electrodynamics*, 3$^{rd}$ Edition, J. D. Jackson, Ch. 6© 1999), as described herein.

For example, consider a case of N-layers, where N is a natural number. Layer N represents the substrate, into which the radiation is transmitted from layer N−1 of the stack at the interface. $n_m$ denotes the index of refraction of a layer m (m=0, 1, . . . , N−1). $z_m$ denotes the coordinate value in a predetermined direction at the interface between the layer m and an adjacent layer m+1 subject to $z_0$=0. The case m=0 represents the medium in which the electromagnetic radiation resides when it is incident upon the top layer (m=1) of the dielectric stack. $F_m$ denotes the forward electric field complex amplitude in layer m for the radiation propagating in the predetermined direction. $R_m$ denotes the reflected electric field complex amplitude in layer m for the reflected radiation propagating in the opposite direction (m=0, 1, ..., N). Physically, the reflected components $R_m$ are generated by the discontinuity in index of refraction at the interfaces (i.e., between layers m−1 and m for m=1, 2, ..., N).

Continuity of the electric field and its derivative at the interface between layers m−1 and m (m=1, 2 ... N), respectively, results in the following equations:

$$F_{m-1}\exp(ik_{m-1}z_{m-1})+R_{m-1}\exp(-ik_{m-1}z_{m-1})=F_m\exp(ik_m z_m)+R_m\exp(-ik_m z_m) \quad (1)$$

$$k_{m-1}F_{m-1}\exp(ik_{m-1}z_{m-1})-k_{m-1}R_{m-1}\exp(-ik_{m-1}z_{m-1})=k_m F_m\exp(ik_m z_m)-k_m R_m\exp(-ik_m z_m) \quad (2)$$

where $k_m=1/(2\pi n_m \lambda)$. Note that "i" in $\exp(\pm ik_m z_m)$ denotes the square root of −1 and should not be confused with the use of "i" as a subscript in the description of the present invention herein.

Exemplary boundary conditions are $F_0=1$ and $R_N=0$. Thus, for the preceding exemplary boundary conditions, equations (1)-(2) above provide 2N linear equations and there are 2N unknowns ($F_1, \ldots, F_N, R_0, \ldots, R_{N-1}$) which may be solved by any method known to a person of ordinary skill in the art (e.g., matrix inversion). The resultant transmission coefficient T is calculated as $T=(1-|R_0|^2)/|F_0|^2$; i.e. or $T=1-|R_0|^2$ for the assumed $F_0=1$ with the preceding exemplary boundary conditions. Note that the assumption of $F_0=1$ is arbitrary and any numerical value could have been chosen for $F_0$, since the transmission coefficient is the fraction of transmitted energy flux and therefore does not depend on the magnitude of $F_0$. The preceding exemplary boundary condition of $R_N=0$ may occur if all of the radiation entering layer N through the stack is absorbed in layer N.

Given the general formulation set out above, the 'impedance tuning' of incident radiation of the present invention can be accomplished. Specifically, when a dielectric layer is added above a stack wherein it is desirable to leave the net reflectivity unchanged, the thickness of the added layer can be preferentially selected to be equal to an integer multiple of one-half of the wavelength of the incident radiation (in the added medium). In a first case, the added layer becomes effectively transparent to the incident radiation and the net reflectivity is unchanged. A second useful case is when a dielectric with dielectric constant equal to the geometric mean of the dielectric constants of the medium from which the radiation enters the added layer, and that of the layer below the added medium. For example, radiation in air, or vacuum, ($\varepsilon_0=1$) enters a layer of silicon (the relative permittivity of silicon $\varepsilon_{si}=11.7$ and the index of refraction of silicon $n_{si}=3.42$). If a layer of SiO2 of thickness that is equal to ¼ the wavelength ($\lambda$) of radiation in SiO2, then since the relative permittivity of SiO2 $\varepsilon_{SiO2}=3.9 \sim 3.42=\sqrt{1*11.7}=\sqrt{\varepsilon_0 \varepsilon_{si}}$ the incident radiation will be nearly 100% transmitted into the dielectric stack with little net reflection.

The present invention combines these two cases to tune dielectric stacks. Specifically, in the structure 100, 200 a first thickness (see thickness 111a of FIG. 1 and thickness 111b of FIG. 2) of the first film 110 can be selectively different from a second thickness 121 of the second film 120 such that a first net reflectivity of the first sections 101 (i.e., the net reflectivity of the first film 110, the insulator layer 130 and the substrate 150) is approximately equal to a second net reflectivity of the second sections 102 (i.e., the net reflectivity of the second film 120, the insulator layer 130 and the substrate 150). This can be accomplished, for example, if the first thickness of the first film 110 comprises a multiple of one-half the first reflectivity wavelength (i.e., a multiple of ½ $\lambda_{Si}$, for example, see first thickness 111a of the FIG. 1 which is ½ $\lambda_{Si}$, or first thickness 111b of FIG. 2 which is $\lambda_{Si}$), if the third thickness 131 of the insulator layer 130 comprises an odd multiple of one-quarter of the second reflectivity wavelength (i.e., an odd multiple of ¼ $\lambda_{SiO2}$) and if a combined thickness 123 of the insulator layer 130 and the second film 120 comprises an odd multiple of one-quarter of the second reflectivity wavelength (i.e., an odd multiple of ¼ $\lambda_{SiO2}$, which occurs if the second thickness 121 of the second film 120 comprises a multiple of one-half the second reflectivity wavelength (i.e., a multiple of ½ $\lambda_{SiO2}$).

A second film 120 (i.e., an STI layer) and insulator layer 130 with a combined thickness that is an odd multiple of ¼ $\lambda_{SiO2}$ provides efficient coupling of the radiation into the substrate. Similarly, by using an insulator layer 130 (i.e., the buried oxide layer) with a thickness 131 that is an odd multiple of ¼ $\lambda_{SiO2}$ and a first film 110 (i.e., an active silicon layer) with a thickness 111a, 111b that is a multiple of ½ $\lambda_{si}$, the incident radiation 'sees' the first film 110 (i.e., the active silicon layer) as transparent (as per the first case described above) and the isolation layer 130 provides an impedance match to the underlying silicon substrate 150. Thus, both the STI regions 102 and device regions 101 are approximately 'matched' to transmit the incoming radiation in similar fractions to the wafer, thereby providing uniform heating.

Figure 3:
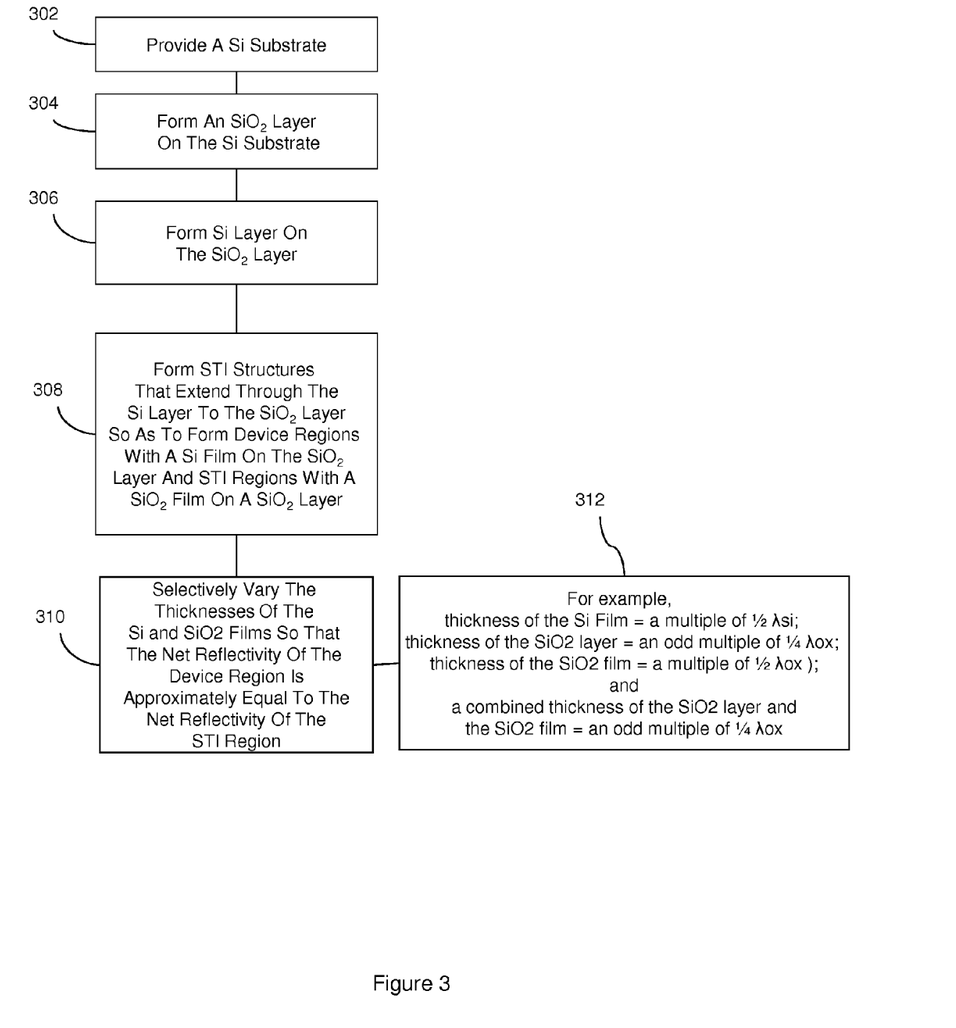
FIG. 3 is a flow diagram illustrating embodiments of the method of forming structures 100 of FIG. 1 and 200 of FIG. 2.

Also disclosed are embodiments of the method for forming the semiconductor wafer structures 100, 200, described above. Referring to FIG. 3 in combination with FIGS. 1 and 2, the structures 100, 200 are formed by forming a semiconductor substrate 150 (302). Then, an insulator layer 130 having a predetermined thickness (i.e., thickness 131) is formed on the substrate 150.

Next, a first film 110 is formed on a first portion of the insulator layer 130 and a second film 120 is also formed on a second portion of the insulator layer 130 adjacent to the first film 110. The first film 110 and the semiconductor substrate 150 can each be formed with a semiconductor having a first reflectivity wavelength (e.g., $\lambda_{si}$) and the second film 120 and the insulator layer 130 can each be formed with an insulator with a second reflectivity wavelength (e.g., $\lambda_{SiO2}$).

Forming of the first and second films 110, 120 adjacent to each other on the same insulator layer 130 can be accomplished using conventional processing techniques used to form isolated active silicon regions for devices 101 adjacent to shallow trench isolation (STI) regions 102 on the same wafer. For example, a semiconductor layer (e.g., a silicon layer) can be formed (e.g., deposited) on the insulator layer 130 (306). Then, trenches can be lithographically patterned and etched into the semiconductor layer, exposing portions of the insulator layer 130. The trenches can be filled with insulator (e.g., SiO$_2$). Thus, device regions 101 with a first film 110 (e.g., a Si film) on the insulator layer 130 (e.g., SiO$_2$ layer) and STI regions 102 with a second film 120 (e.g, SiO$_2$ film) on an adjacent portion of the insulator layer.

The first and second films 110, 120 are each formed with different predetermined thicknesses 111, 121, respectively, such that a first net reflectivity of the first film 110, the insulator layer 130, and the substrate 150 is approximately equal to a second net reflectivity of the second film 120, the insulator layer 130 and the substrate 150 (i.e., the first film 110 is formed with a first thickness 111a, 111b that is selectively different from a second thickness 121 of the second film 120 so that the first net reflectivity is approximately equal to the second net reflectivity) (310). Thus, the first and second films are formed with different thicknesses in order to eliminate or minimize reflectivity differences across the wafer (i.e., to ensure the reflectance and absorption characteristics across the wafer are approximately equal or uniform).

More specifically, the insulator layer 130 can be formed (e.g., grown or deposited and planarized) such that it has a predetermined thickness (i.e., a third thickness 131). Then, the first film 110 is bonded to the insulator layer 131, and thinned to the desired thickness. Trenches can be formed through the first film 110 and then, the second film 120 can be deposited. The first and second films 110, 120 can be planarized to either the desired first thickness of the first film 110 or the desired second thickness of the second film, which ever is greater. Then, the film with the lesser predetermined thickness can be selectively etched back. For example, as illustrated in FIG. 1, the film 110 may be etched back to achieve the lesser thickness 111a of first film 110. Alternatively, as illustrated in FIG. 2, the film 120 may be etched back to achieve the lesser thickness 121 of the second film 120.

To ensure that the first net reflectivity of the device regions 101 is approximately equal to the second net reflectivity of the STI regions 102, the various layers 131, 110 and 120 can be formed with the following predetermined thickness (312). The insulator layer 130 can be formed with a predetermined thickness 131 that is an odd multiple of one-quarter of the second reflectivity wavelength (i.e., an odd multiple of ¼ $\lambda_{SiO2}$). The first film 110 can be formed with a predetermined thickness that is a multiple of one-half the first reflectivity wavelength (i.e., a multiple ½ $\lambda_{Si}$). Finally, the second film 120 can be formed with a predetermined thickness that is a multiple of one-half the second reflectivity wavelength (i.e., a multiple of ½ $\lambda_{SiO2}$) such that the combined thickness of the insulator layer and the second film is an odd multiple of one-quarter of the second reflectivity wavelength (i.e., an odd multiple of ¼ $\lambda_{SiO2}$).

Another embodiment of the semiconductor wafer structure of the invention comprises multiple sections. Each section comprises a different material with a different reflectivity, but the same thickness. However, a reflectance layer is incorporated into the structure above the substrate and below the different materials in order to balance reflectivity (i.e., eliminate or minimize differences in reflectivity) from section to section.

Figure 4:
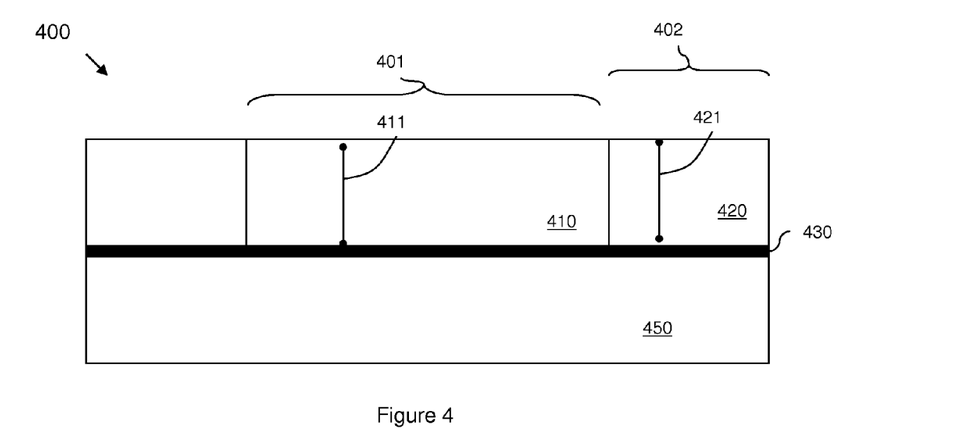
FIG. 4 is a schematic diagram illustrating an exemplary wafer structure 400 of the invention.
Figure 5:
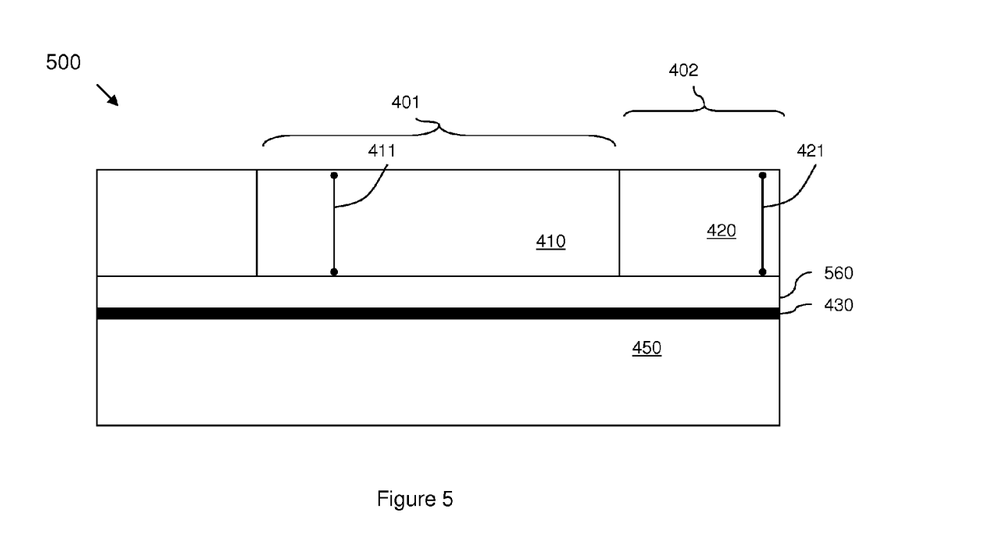
FIG. 5 is a schematic diagram illustrating an exemplary wafer structure 500 of the invention.
Figure 6:
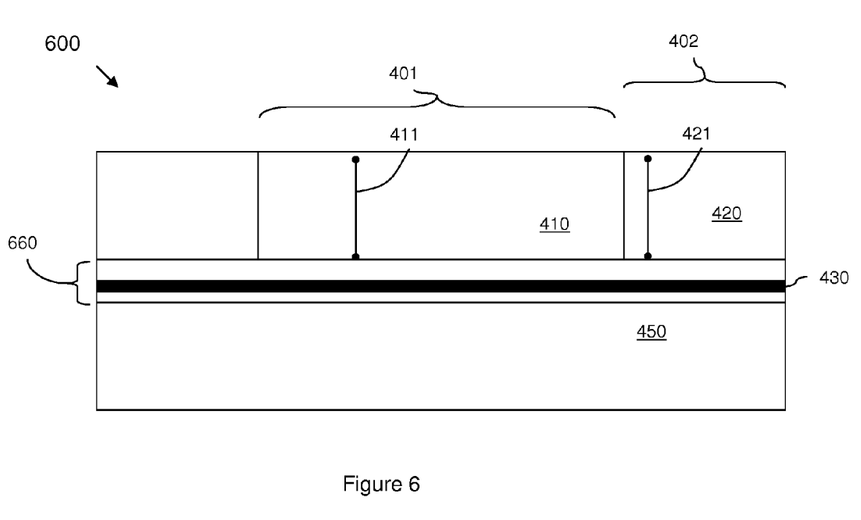
FIG. 6 is a schematic diagram illustrating an exemplary wafer structure 600 of the invention.

More particularly, referring to FIGS. 4, 5 and 6, the wafer structures 400, 500 and 600 of this embodiment of the invention can each comprise a semiconductor substrate 450 and at least one first section 401 and at least one second section 402. The first section 401 (e.g., a device region) can comprise a first material 410 (e.g., silicon) with a first index of refraction (and, thus, a first reflectivity wavelength) and with a first thickness 411 above a first portion of the semiconductor substrate 450. The second section 402 (e.g., a shallow trench isolation region) can comprise a second material 420 (e.g., silicon dioxide) with a second index of refraction (and, thus, a second reflectivity wavelength) and with a second thickness 421 above a second portion of the semiconductor substrate 450 and adjacent to the first material 410. The thicknesses 411, 421 of the first and second materials 410, 420 can be approximately equal. However, the first and second materials 410, 420 are different and, thus, so are their indices of refraction and their corresponding reflectivity wavelengths.

The semiconductor wafer structures 400, 500 and 600 can each further incorporate a reflectance layer 430 between the semiconductor substrate 450 and the first and second materials 410, 420. This reflectance layer 430 can comprise a preselected material that balances the reflectivity (i.e., eliminates or minimizes the reflectivity differences) between the first and second sections 401, 402. This embodiment can be advantageous when the combination of semiconductor and dielectric isolation dielectric constants do not easily admit a solution according to the previous embodiment. For example, in a bulk CMOS process the active device regions 401 would largely comprise only the silicon bulk with $n_{Si}$=3.42 and isolation regions 402 would comprise a layer of $SiO_2$ above the silicon bulk. The device regions 401 in this case would be highly reflective (~60%) while the isolation regions 402 would be only moderately reflective (~20-30%) due to the impedance matching effects of the $SiO_2$ in the isolation region, previously discussed. Through addition of a layer 430 of SiGe, with an index of refraction $n_{SiGe}$=4 (for approximately 20% Ge content) a destructive interference in the reflected wave in the device region 401 can be introduced, thereby increasing the transmission and thus heating of the device regions during rapid thermal anneal. The reflections in the isolation region 402 can be increased by judicious choice of the thickness of layer 430, and thus an improvement in the uniformity of heating during rapid thermal anneal can be attained.

This reflectance layer 430 can alternatively be incorporated into the structure either immediately above the substrate 450 (e.g., in a bulk wafer, as illustrated in the structure 400 of FIG. 4, or a silicon-on-insulator (SOI) wafer, as illustrated in the structure 500 of FIG. 5) or within an insulator layer that is positioned between the substrate 450 and the first and second materials 410, 420 (e.g., within the buried oxide layer 660 of an SOI wafer, as illustrated in FIG. 6). Specifically, referring to the structure 400 of FIG. 4, the reflectance layer 430 can comprise a semiconductor layer (e.g., a silicon germanium layer) that is positioned directly on the semiconductor substrate 450 of a bulk wafer and the first and second materials 410, 420 can be positioned directly on reflectance layer 430.

Referring to structure 500 of FIG. 5, the reflectance layer 430 can also comprise a semiconductor layer (e.g., a silicon germanium layer) that is positioned between the substrate 450 and the insulator layer 560 of an SOI wafer and the first and second materials 410, 420 can be positioned on the insulator layer 560. Alternatively, referring to the structure 600 of FIG. 6, the reflectance layer 430 can be embedded within the insulator layer 660 of an SOI wafer upon which the first and second materials 410, 420 are positioned. This embedded reflectance layer can comprise a silicon layer, a silicon germanium layer or another different isolation layer (e.g., a nitride layer).

Figure 7:
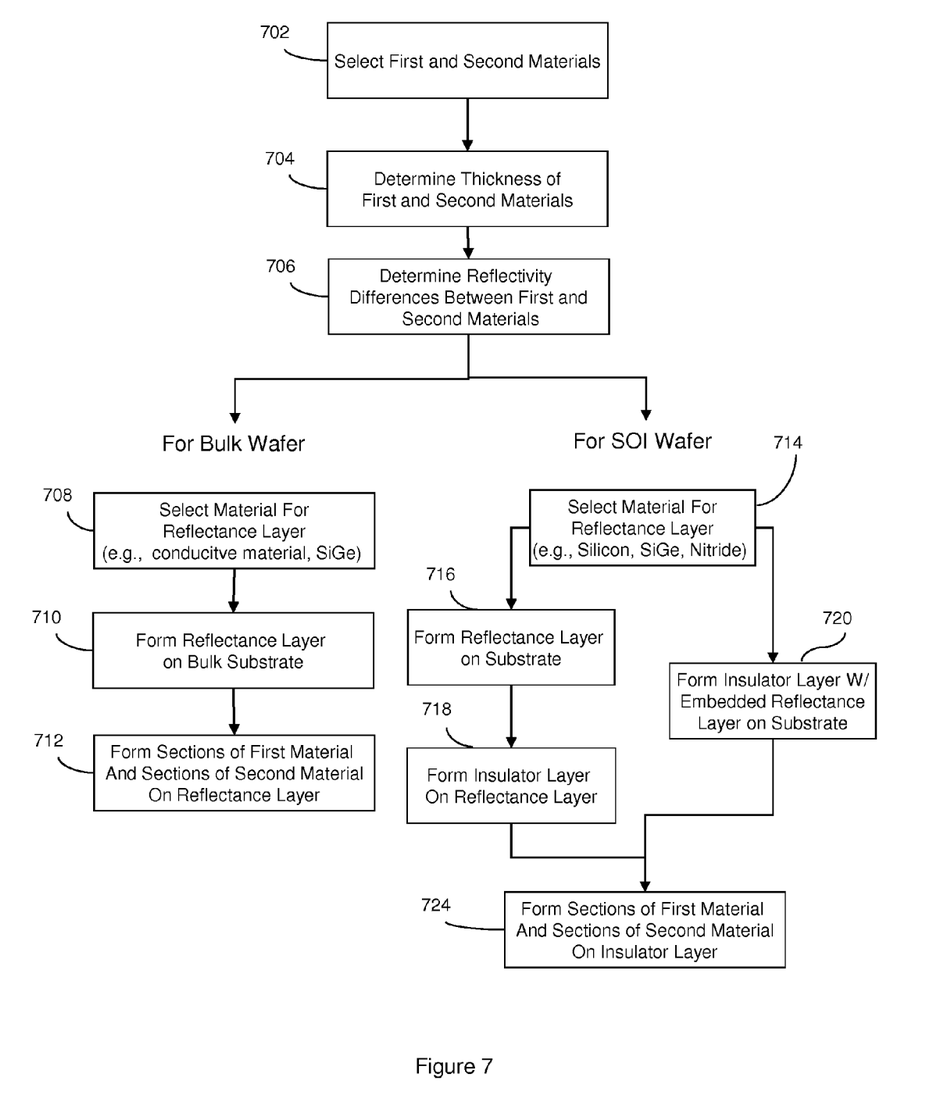
FIG. 7 is a flow diagram illustrating embodiments of the method of forming structures 400 of FIG. 4, 500 of FIG. 5 and 600 of FIG. 6.

Referring to FIG. 7, also disclosed are embodiments of a method of forming the semiconductor wafer structures 400, 500 and 600 described above.

The method comprises selecting materials for the wafer structure (702). For example, selecting a first material, such as silicon, to form the first section (e.g., a device region) and selecting a second material (e.g., silicon dioxide) to form the second section (e.g., a shallow trench isolation region). The thicknesses of the materials in each section are determined (704) and so are the reflectivity differences between the materials (706).

Based on the reflectivity differences determined at process 706, the material that will be used for the reflectance layer is selected (see process 708 or 714, discussed below).

For a bulk wafer, the selected material can comprise a semiconductor material (e.g., silicon germanium) (708). Then, the wafer is formed with the materials and dimensions determined above. That is, the reflectance layer 430 can be formed on the bulk substrate (710) and then, the first and second sections can be formed on the reflectance layer (712). For example, referring to the structure 400 of FIG. 4, a silicon germanium layer (i.e., the reflectance layer 430) can be epitaxially grown on the semiconductor substrate 450. Then, a silicon layer can be epitaxially grown onto the reflectance layer 430. Trenches can be etched through the silicon layer to the reflectance layer and filled with an insulator material (e.g., silicon dioxide ($SiO_2$)) in order to form shallow trench isolation (STI) regions. Thus, first sections 401 comprising silicon device regions and second sections 402 comprising silicon dioxide filled shallow trench isolation regions are formed above the reflectance layer 430.

For a silicon-on-insulator wafer, the selected material can comprise silicon, silicon germanium or another insulator material that is different from the insulator layer of the SOI wafer (e.g., a nitride material) (714). In this case, the wafer structure can be formed with the above-determined materials and dimensions so that the reflectance layer is either between the substrate and the insulator layer of the SOI wafer (716-718) or within the insulator layer of the SOI wafer (720-722). Specifically, referring to the structure 500 of FIG. 5, once the material for the reflectance layer 430 is selected at process 714 (e.g., a semiconductor material, such as silicon germanium or a different insulator layer, such as a nitride), the reflectance layer 430 can be formed (e.g., epitaxially grown in the case of silicon germanium) on the substrate 450 (716). After formation of the reflectance layer 430, an insulator layer 560 can be formed (e.g., deposited) on the reflectance layer 430 (718) and the first and second sections 401, 402 can be formed on the insulator layer 560 in the same manner as described above at process 712 (724). Alternatively, referring to structure 600 of FIG. 6, after the material for the reflectance layer 430 is selected at process 714, an insulator layer 660 with an embedded reflectance layer 430 can be formed on the substrate 450 using conventional processing techniques (e.g., by depositing a first bottom portion of the insulator layer, depositing the reflectance layer, and depositing a second top portion of the insulator layer) (720). Then, the first and second sections 401, 402 can be formed on the insulator layer 660 in the same manner as described above at process 712 (724).

Therefore, disclosed herein are embodiments of semiconductor wafer structures and associated methods of forming the structures with balanced reflectance and absorption characteristics. The reflectance and absorption characteristics are balanced (i.e., differences are eliminated or minimized) by manipulating thin film interferences. Specifically, thin film interferences are employed by ensuring that the wavelength values representing the overall reflectivities in each section of the wafer are approximately equal to multiples of $\frac{1}{2}\lambda$ in the various thin films as needed to balance over all absorption. Additionally or alternatively, reflectance and absorption characteristics can be balanced by incorporating an additional reflectance layer into the wafer structure above the substrate.

It should be noted that the inventors of the above embodiments have invented the following additional inventions related to the reflectance and absorption characteristics of wafers during rapid thermal anneals, each of which is being filed simultaneously herewith and is fully incorporated herein by reference: (1) co-pending U.S. patent application Ser. No. 11/678,783, titled "Localized Temperature Control During Rapid Thermal Anneal", (2) co-pending U.S. patent application Ser. No. 11/678,745, titled "Structure And Method For Device-Specific Fill For Improved Anneal Uniformity", and (3) co-pending U.S. patent application Ser. No. 11/678,799, titled "Localized Temperature Control During Rapid Thermal Anneal".

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of forming a semiconductor structure, said method comprising:
    forming a substrate;
    forming an insulator layer on said substrate; and
    forming a first film on a first portion of said insulator layer and a second film, different from said first film, on a second portion of said insulator layer adjacent to said first film such that a first net reflectivity of said first film, said insulator layer and said substrate is approximately equal to a second net reflectivity of said second film, said insulator layer and said substrate.

2. The method of claim 1, wherein said forming of said first film and said second film such that said first net reflectivity is approximately equal to said second net reflectivity comprises forming said first film with a first thickness that is selectively different from a second thickness of said second film.

3. The method of claim 2,
    wherein said first film and said semiconductor substrate are each formed with a semiconductor having a first reflectivity wavelength, and
    wherein said second film and said insulator layer are each formed with an insulator with a second reflectivity wavelength.

4. The method of claim 3, wherein said forming of said insulator layer further comprises forming said insulator layer with a third thickness that is an odd multiple of one-quarter of said second reflectivity wavelength.

5. The method of claim 3, wherein said forming said first film with said first thickness that is selectively different from said second thickness of said second film further comprises:
    forming said first film such that said first thickness is a multiple of one-half said first reflectivity wavelength; and
    forming said second film such that a combined thickness of said insulator layer and said second film comprises an odd multiple of one-quarter of said second reflectivity wavelength.

6. A method of forming a semiconductor structure, said method comprising:
    forming a reflectance layer above a semiconductor substrate;
    forming, above said reflectance layer, a first material on said reflectance layer such that said reflectance layer is between said first material and said semiconductor substrate in a first section of said structure and such that said first material has a first thickness; and
    forming, above said reflectance layer, a second material that is different from said first material such that said reflectance layer is between said second material and said semiconductor substrate in a second section of said structure and such that said second material has a second thickness that is approximately equal to said first thickness,
    wherein said first material is different from said second material, and
    wherein said reflectance layer ensures that a first net reflectivity of said first section is approximately equal to a second net reflectivity of said second section.

7. The method of claim 6, said first material and said semiconductor substrate comprising a same first semiconductor material and said reflectance layer comprising a second semiconductor material different from said first semiconductor material.

8. The method of claim 6, said first material and said semiconductor substrate comprising silicon and said reflectance layer comprising silicon germanium.

9. The method of claim 7, further comprising, before said forming of said first material and said forming of said second material, forming an insulator layer on said reflectance layer such that said insulator layer will be positioned between said first material and said reflectance layer and further between said second material and said reflectance layer.

10. The method of claim 6, further comprising, before said forming of said first material and said forming of said second material, forming an insulator layer on said semiconductor substrate such that said reflectance layer is embedded within said insulator layer and such that said insulator layer will be positioned between said semiconductor substrate and said first material and further between said semiconductor substrate and said second material.

11. A method of forming a semiconductor structure, said method comprising:
  forming a substrate;
  forming an insulator layer on said substrate; and
  forming a first film on a first portion of said insulator layer and a second film on a second portion of said insulator layer adjacent to said first film such that a first net reflectivity of said first film, said insulator layer and said substrate is approximately equal to a second net reflectivity of said second film, said insulator layer and said substrate, and
  wherein said forming of said first film and said second film such that said first net reflectivity is approximately equal to said second net reflectivity comprises forming said first film with a first thickness that is selectively different from a second thickness of said second film.

12. The method of claim 11,
  wherein said first film and said semiconductor substrate are each formed with a semiconductor having a first reflectivity wavelength, and
  wherein said second film and said insulator layer are each formed with an insulator with a second reflectivity wavelength.

13. The method of claim 12, wherein said forming of said insulator layer further comprises forming said insulator layer with a third thickness that is an odd multiple of one-quarter of said second reflectivity wavelength.

14. The method of claim 12, wherein said forming said first film with said first thickness that is selectively different from said second thickness of said second film further comprises:
  forming said first film such that said first thickness is a multiple of one-half said first reflectivity wavelength; and
  forming said second film such that a combined thickness of said insulator layer and said second film comprises an odd multiple of one-quarter of said second reflectivity wavelength.

* * * * *